(12) United States Patent
Sweeney et al.

(10) Patent No.: US 10,892,137 B2
(45) Date of Patent: Jan. 12, 2021

(54) ION IMPLANTATION PROCESSES AND APPARATUS USING GALLIUM

(71) Applicant: ENTEGRIS, INC., Billerica, MA (US)

(72) Inventors: Joseph D. Sweeney, New Milford, CT (US); Joseph R. Despres, Middletown, CT (US); Ying Tang, Brookfield, CT (US); Sharad N. Yedave, Danbury, CT (US); Edward E. Jones, Woodbury, CT (US); Oleg Byl, Southbury, CT (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 16/564,965

(22) Filed: Sep. 9, 2019

(65) Prior Publication Data

US 2020/0083015 A1     Mar. 12, 2020

Related U.S. Application Data

(60) Provisional application No. 62/730,198, filed on Sep. 12, 2018.

(51) Int. Cl.
*H01J 37/08* (2006.01)
*H01J 37/317* (2006.01)

(52) U.S. Cl.
CPC .......... *H01J 37/08* (2013.01); *H01J 37/3171* (2013.01); *H01J 2237/061* (2013.01)

(58) Field of Classification Search
None
See application file for complete search history.

(56) References Cited

U.S. PATENT DOCUMENTS

| 6,135,128 | A | 10/2000 | Graf | |
| 9,299,529 | B2* | 3/2016 | Tanjo | H01J 37/08 |
| 9,396,902 | B2* | 7/2016 | Biloiu | H01J 37/08 |
| 2004/0000651 | A1 | 1/2004 | Horsky | |
| 2012/0255490 | A1 | 10/2012 | Tanjo | |
| 2013/0313971 | A1 | 11/2013 | Biloiu | |
| 2014/0326594 | A1 | 11/2014 | Biloiu | |

FOREIGN PATENT DOCUMENTS

| TW | 201807235 A | 3/2018 |
| WO | 2013148463 A1 | 10/2013 |

* cited by examiner

*Primary Examiner* — Vip Patel
(74) *Attorney, Agent, or Firm* — Entegris, Inc.

(57) ABSTRACT

An ion source apparatus for ion implantation is described, including an ion source chamber, and a consumable structure in or associated with the ion source chamber, in which the consumable structure includes a solid dopant source material susceptible to reaction with a reactive gas for release of dopant in gaseous form to the ion source chamber, wherein the solid dopant source material comprises gallium nitride, gallium oxide, either of which may be isotopically enriched with respect to a gallium isotope, or combinations thereof.

18 Claims, 10 Drawing Sheets

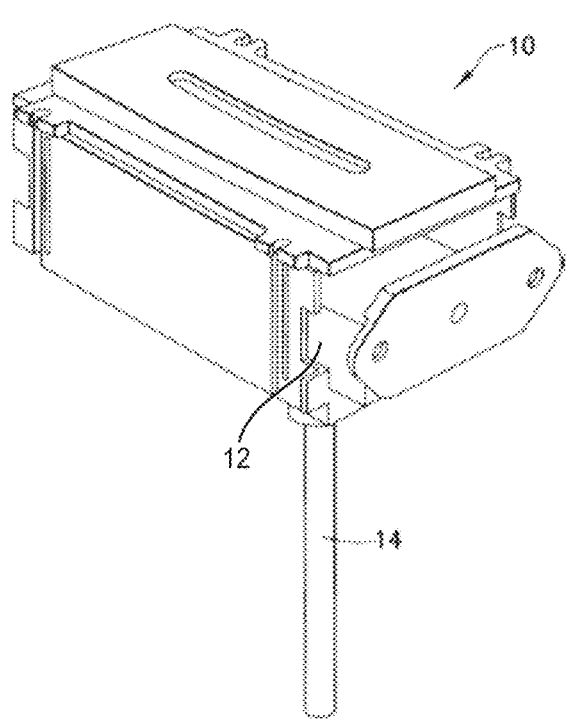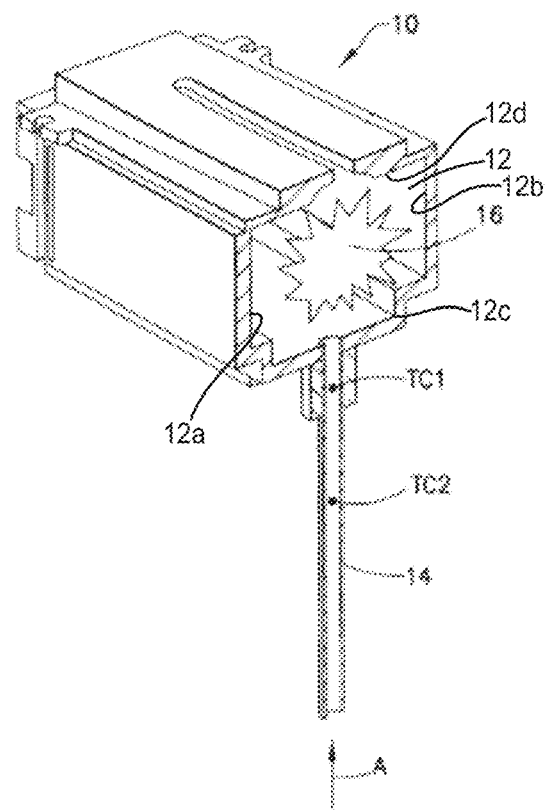
FIG. 1     FIG. 2
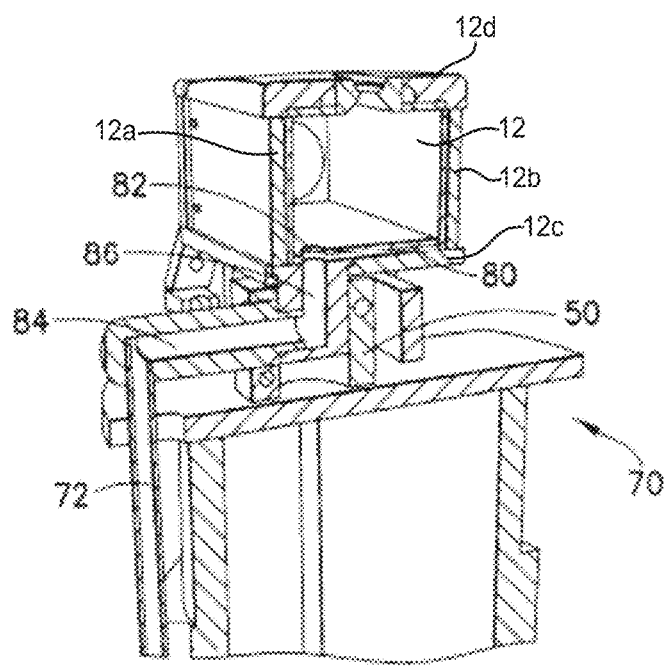
FIG. 3

ION IMPLANTATION PROCESSES AND APPARATUS USING GALLIUM

FIELD

The present disclosure relates to ion implantation systems and methods, wherein gallium species are provided or generated in situ to an ion source chamber of an ion implantation apparatus, with examples of the systems and methods involving gallium nitride and gallium oxide precursor as solid gallium dopant precursor compositions.

BACKGROUND

In the use of dopant source materials for ionization to form dopant species for ion implantation, a wide variety of dopant source materials for generating dopant species have been developed.

In many cases, the dopant source materials do not have sufficiently high vapor pressure for efficient delivery to the ion source chamber of the ion implantation system. The use of such dopant source materials having low vapor pressure therefore may require substantial tool modification of the ion implantation apparatus, to enable delivery at high temperatures that are required to adequately volatilize the dopant source material and prevent its condensation and deposition in flow lines of the ion implantation system. Vaporizers and flow circuitry accommodating such high temperature operation must therefore be employed.

The use of high temperatures, however, is problematic, because the dopant source materials may be susceptible to decomposition and side reactions that make the ion implant process difficult to control within allowable tolerances for the production of ion implanted structures and devices. In addition, the use of high temperatures restricts the use of control valves so that vapor flow control is adversely affected. These factors in turn lead to long changeover times from one dopant source material to another, and may also present safety hazards when vaporizers are not isolated from the ambient environment during installation or replacement or refilling of the vaporizer.

The foregoing problems have been encountered in ion implantation of gallium as a dopant species, for which the choice of acceptable dopant source materials is limited, due to the relatively small number of feed materials with sufficiently high vapor pressure for efficient delivery to the ion source chamber of the ion implantation system. The ion implantation art therefore continues to seek new gallium precursor compositions.

It would be a substantial advance in the art to provide new approaches that enable low vapor pressure dopant source materials to be efficiently used in ion implantation applications for implanting corresponding dopant species, as in the case of gallium dopant species, for which relatively few high vapor pressure dopant precursors exist.

SUMMARY

The present disclosure relates to ion implantation apparatus and processes in which gallium dopant species are generated in a manner that allows a solid, low vapor pressure gallium source material to be used.

In one aspect, the disclosure relates to an ion source apparatus for ion implantation, comprising: an ion source chamber; and a consumable structure in or associated with the ion source chamber, said consumable structure comprising a solid dopant source material that contains gallium nitride or gallium oxide; the gallium nitride or gallium oxide is susceptible to reaction with a reactive gas for release of gallium in gaseous form to the ion source chamber.

In another aspect, the disclosure relates to a method of conducting ion implantation, comprising: generating ionized gallium in an ion source chamber for said ion implantation, wherein the ion source chamber has a consumable structure in associated therewith, and wherein the consumable structure comprises a solid dopant source material comprising gallium nitride or gallium oxide that is susceptible to reaction with a reactive gas for release of gallium in gaseous form to the ion source chamber for ionization therein to form ionized gallium as a dopant, said method comprising contacting the consumable structure with the reactant gas for said generating of ionized gallium. The solid dopant source material can contain gallium nitride (GaN), gallium oxide ($Ga_2O_3$), an isotopically enriched analog of gallium nitride (GaN) or gallium oxide ($Ga_2O_3$) comprising gallium isotopically enriched above natural abundance in $^{69}Ga$ or $^{71}Ga$, or a combination thereof.

In a further aspect, the disclosure relates to a method of improving performance of an ion implantation system with respect to at least one of beam current, ion source life, and glitch rate characteristics thereof, said method comprising: generating ionized gallium in an ion source chamber of said ion implantation system, wherein the ion source chamber has a consumable structure in associated therewith, and wherein the consumable structure comprises a solid dopant source material comprising gallium nitride, gallium oxide, or a combination of gallium nitride and gallium oxide, the solid dopant source material being susceptible to reaction with a reactive gas for release of gallium in gaseous form to the ion source chamber for ionization therein to form ionized gallium, said method comprising contacting the consumable structure with the reactant gas.

The present disclosure also relates to solid gallium precursor compositions having utility for ion implantation and other semiconductor manufacturing and industrial applications and that contain gallium nitride, gallium oxide, or both, and that are in the form of a solid sheet of material that can be used as a replaceable liner of an arc chamber.

A further aspect of the disclosure relates to a gallium ion implantation process, comprising ionizing a gallium precursor to form gallium implant species, and implanting the gallium implant species in a substrate, wherein the gallium precursor comprises one or more precursor material selected from: an isotopically enriched analog of gallium nitride (GaN), gallium oxide ($Ga_2O_3$), or a combination thereof, comprising gallium isotopically enriched above natural abundance in $^{69}Ga$ or $^{71}Ga$, or a combination thereof.

BRIEF DESCRIPTION OF THE DRAWINGS

FIG. 1 is a schematic representation of an ion implantation system, including an arc chamber with a gas feed line for feeding dopant source gas to the arc chamber for ionization thereof in the chamber.

FIG. 2 is a cross section of the FIG. 1 ion implantation system schematically showing the generation of a plasma in the arc chamber of such system.

FIG. 3 is a perspective view, in cross-section, of an ion source assembly comprising an ion source apparatus and heat sink apparatus for thermal management of the ion source apparatus.

DETAILED DESCRIPTION

Figure 4:
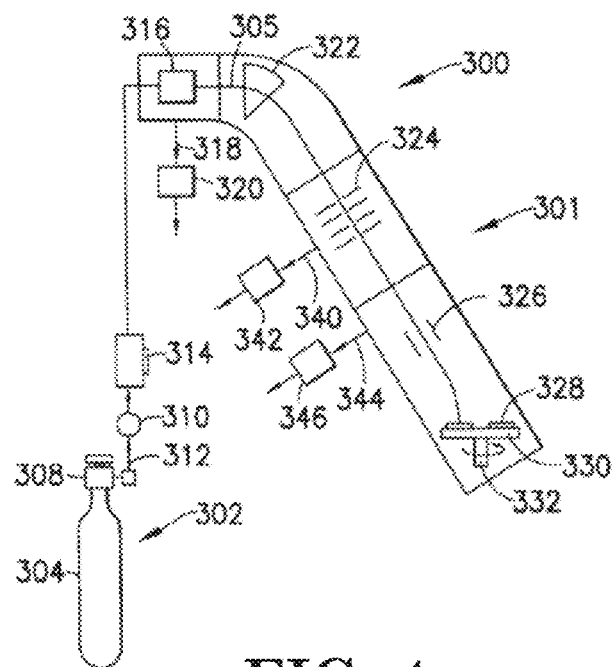
FIG. 4 is a schematic representation of an ion implant process system including a storage and dispensing vessel containing gas which is supplied for ion implantation doping of a substrate in the illustrated ion implant chamber.

The present disclosure relates to ion implantation, and in various aspects to apparatus and methods in which gallium dopant is generated in a manner that allows for a low vapor pressure dopant source material to be used.

In one aspect, the disclosure relates to an ion source apparatus for ion implantation. The apparatus includes an ion source chamber and a consumable structure in or associated with the ion source chamber. The consumable structure includes a solid dopant source material susceptible to reaction with a reactive gas for release of dopant in gaseous form to the ion source chamber. The solid dopant source material includes gallium nitride, gallium oxide, or a combination of these. Optionally, the gallium of the gallium nitride (GaN), gallium oxide ($Ga_2O_3$), or combination thereof may contain gallium that is isotopically enriched above natural abundance in $^{69}Ga$ or $^{71}Ga$, or a combination thereof.

The consumable structure in the ion source apparatus may comprise a sheet structure disposed in the ion source chamber, such as a liner or other structural components of the ion source chamber. A liner may be a removable liner, meaning a flat, e.g., planar piece of consumable structure having two opposed major surfaces and a thickness therebetween. A liner may be rectangular, curved (e.g., rounded), angular, or otherwise shaped. A liner may be removable, meaning that the liner can be inserted and removed from the interior space of the ion source chamber. A removable liner may be used for a period of processing wherein gallium ions are generated from the removable liner, and after a useful amount of processing to generate gallium ions the removable liner may be removed from the ion source apparatus and replaced with another removable liner.

In other embodiments of the invention the sheet structure can different sizes and shapes to fit inside the arc chamber.

In certain embodiments, one or more sheets of the sidewall, bottom, or top of the arc chamber can be replaces by a sheet structure.

According to certain examples of useful or preferred ion source chambers, an interior of a chamber of an ion source can include or more sheets or liners, which may be removable, and that may cover from about 5 percent to about 80 percent of a total interior surface area of the chamber, for example between 10, 15, 20, 30, 50, or 70 percent of the total interior surface area. For this calculation, the total interior surface area includes all planar areas of the interior including areas that are otherwise occupied by or covered by a feature that may desirably not be covered, such as an anti-cathode, cathode, or an inlet or outlet opening that allows gas or ions to enter or exit the arc chamber.

In other examples, the consumable structure may be a structure that is otherwise associated with the ion source chamber, such as a gas delivery tube coupled to the ion source chamber (but external to the ion source chamber interior), or other structural component of an associated character that is constructed and arranged to provide dopant in gaseous form to the interior of the ion source chamber as a result of reaction with reactive gas contacted with the structural component.

An ion source chamber may contain consumable structures that are made of different gallium materials. A single ion source chamber may include a combination of one or more removable liner, gas delivery tube, etc., wherein different individual removable liners or gas delivery tubes contain a combination of GaN and $Ga_2O_3$, in the same ion source chamber; a single ion source chamber may include one or more liners that contain GaN, in combination with one or more liners that contain $Ga_2O_3$; i.e., embodiments of the present description involve an ion source chamber and methods of using the ion source chamber wherein the ion source chamber includes two gallium precursor materials, one that is made to contain GaN and one that is made to contain $Ga_2O_3$, each precursor material may be part of a consumable structure such as a removable liner or a gas delivery tube.

The consumable structure has a shape, form, and size such as to be consumable by reaction with the reactant gas to form the precursor, without adverse effect on the physical integrity of the ion source apparatus or ancillary equipment, i.e., even if the consumable structure were to be completely consumed, the ion source chamber and ancillary equipment would maintain their physical integrity. For example, the consumable structure may comprise a tubular member that is coaxial with a reactant gas flow passage, wherein the consumption of the consumable tubular member does not impair the physical integrity of the reactant gas flow passage in which the consumable tubular member is disposed. The consumable structure therefore comprises a physical mass, and may be of sheet, rod, tubular, ring, disc, or other appropriate form, as a target for the reactant gas.

In specific examples, the consumable structure may comprise, consist of, or consist essentially of gallium nitride, gallium oxide, or a combination thereof. An example consumable structure may comprise at least 50, 60, 70, 80, 90, or 95 percent by weight gallium nitride, gallium oxide, or a combination thereof. According to the present description, a material or structure that is said to "consist essentially of" a listed material or combination of materials, is a material or structure that contains the listed material or combination of materials and not more than an insubstantial amount of any other ingredients or materials; accordingly, a consumable structure that consists essentially of gallium nitride, gallium oxide, or a combination thereof, contains at least 97, 99, or 99.5 weight percent gallium nitride, gallium oxide, or a combination thereof, and not more than 3, 1, or 0.5 weight percent of any other materials.

The reactive gas or mixture gases used in the operation of such apparatus may be of any suitable type that will be effective to react with the solid dopant source material (gallium nitride or gallium oxide) to release gallium in gaseous form to the ion source chamber. Illustrative gases suitable for such purpose include $BF_3$, $B_2F_4$, $SiF_4$, $Si_2F_6$, $GeF_4$, $PF_3$, $PF_5$, $AsF_3$, $AsF_5$, $XeF_2$, $XeF_4$, $XeF_6$, $WF_6$, $MoF_6$, $C_nF_{2n+2}$, $C_nF_{2n}$, $C_nF_{2n-2}$, $C_nH_xF_{2n+2-x}$, $C_nH_xF_{2n-x}$, $C_nH_xF_{2n-2-x}$ (n=1, 2, 3 ..., x=0, 1, 2 ...), $COF_2$, CO, $CO_2$, $SF_6$, $SF_4$, $SeF_6$, $NF_3$, $N_2F_4$, HF, Xe, He, Ne, Ar, Kr, $N_2$, $H_2$. Examples of combinations of reactant gases include: $BF_3$ with $H_2$; $SiF_4$ with $H_2$; $BF_3$ with Xe; $SiF_4$ with Xe; $BF_3$, and $H_2$ with Xe; and $SiF_4$ and $H_2$ with Xe.

A further aspect of the disclosure relates to a method of conducting ion implantation. The method includes: generating ionized gallium in an ion source chamber for ion implantation, wherein the ion source chamber has a consumable structure in associated therewith, and wherein the consumable structure includes solid dopant source material susceptible to reaction with a reactive gas for release of gallium in gaseous form to the ion source chamber for ionization therein to form ionized gallium species. The method includes contacting the consumable structure with the reactant gas to generate ionized dopant species. The solid dopant source material includes gallium nitride, gallium oxide, or a combination of these. The gallium in the solid dopant source may optionally be isotopically enriched.

In such method, the consumable structure may comprise a sheet structure disposed in the ion source chamber, such as a replaceable liner or other sheet structure of the ion source chamber. The consumable structure may alternatively, or additionally, comprise a structure that is associated with the ion source chamber, e.g., a gas delivery tube that is coupled to the ion source chamber.

Yet a further aspect of the disclosure relates to a method of improving performance of an ion implantation system with respect to at least one of beam current, ion source life, and glitch rate characteristics thereof, said method comprising: generating ionized dopant species in an ion source chamber of said ion implantation system, wherein the ion source chamber has a consumable structure in associated therewith, and wherein the consumable structure comprises a solid dopant source material susceptible to reaction with a reactive gas for release of dopant in gaseous form to the ion source chamber for ionization therein to form said ionized dopant species, said method comprising contacting the consumable structure with the reactant gas for said generating of ionized dopant species. The solid dopant source material contains gallium nitride, gallium oxide, or a combination of these. The solid dopant source material used in such method may comprise an isotopically enriched dopant source material that contains isotopically enriched gallium above natural abundance in at least one isotope thereof.

In various embodiments, the process system may be an ion implantation system in which gallium reactant comprising gallium nitride or gallium oxide is incorporated in an arc chamber of the ion implantation system, in a consumable structure. The process system may comprise a semiconductor process system, e.g., an ion implantation system, or other process system, such as a process system for manufacturing solar panels or flat-panel display products. The precursor may comprise a gallium precursor generated in situ from a gallium reactant such as gallium nitride (GaN) or gallium oxide ($Ga_2O_3$). The reactive gas or mixture gases used in the operation of such apparatus may be of any suitable type that will be effective to react with the solid dopant source material (gallium nitride or gallium oxide) to release gallium in gaseous form to the ion source chamber. Illustrative gases suitable for such purpose include $BF_3$, $B_2F_4$, $SiF_4$, $Si_2F_6$, $GeF_4$, $PF_3$, $PF_5$, $AsF_3$, $AsF_5$, $XeF_2$, $XeF_4$, $XeF_6$, $WF_6$, $MoF_6$, $C_nF_{2n+2}$, $C_nF_{2n}$, $C_nF_{2n-2}$, $C_nH_xF_{2n+2-x}$, $C_nH_xF_{2n-x}$, $C_nH_xF_{2n-2-x}$ (n=1, 2, 3 ..., x=0, 1, 2 ...), $COF_2$, CO, $CO_2$, $SF_6$, $SF_4$, $SeF_6$, $NF_3$, $N_2F_4$, HF, Xe, He, Ne, Ar, Kr, $N_2$, $H_2$. Examples of combinations of reactant gases include: $BF_3$ with $H_2$; $SiF_4$ with $H_2$; $BF_3$ with Xe; $SiF_4$ with Xe; $BF_3$, and $H_2$ with Xe; and $SiF_4$ and $H_2$ with Xe. Furthermore, other reactant gases can include enriched gases of the list of above. For example, but not limited to $eBF_3$, $eGeF_4$.

In the aforementioned methods, flow rate of the gaseous co-reactant may be controlled to achieve a controlled flow rate of the precursor that is produced as a reaction product in the process system.

In various specific embodiments, gallium reactant may be contained in a reactor in the process system, e.g., a heated reactor. The process system may correspondingly comprise an ion implantation system, wherein the reactor temperature gaseous co-reactant flow rates are controlled to achieve a predetermined ion implantation beam current.

The aforementioned method may be carried out in a manner in which the formation of gallium precursor in situ is controlled by a control process that includes at least one of: (i) measurement of amount of the precursor formed by contact of the gaseous co-reactant with the gallium reactant; (ii) identification and quantitation of reaction products of the contact of the gaseous co-reactant with the gallium reactant, (iii) detection of amount of unreacted gaseous co-reactant subsequent to said contact, and (iv) detection of beam current, wherein the process system comprises an ion implantation system.

In other embodiments in which a dedicated reactor is used, the reactor can include multiple reactor beds arranged for switching reactant gas flow from one of said multiple reactor beds when reaching an endpoint condition of depletion of the gallium reactant, to another of said multiple reactor beds containing the gallium reactant.

In such multi-bed reactor arrangements, the endpoint condition for switching may be determined by one or more of: achievement of a predetermined detection of totalized gaseous co-reactant flow; detecting a declining beam current; and analysis of exiting gases from an on-stream one of the multiple reactor beds.

The above-described method may additionally use a precursor gallium reactant that is enriched above natural abundance in at least one isotope thereof.

In other embodiments, the method described above may be carried out, in which a co-flow gas is flowed to or through the process system, e.g., a diluent, equilibrium-directing gas, cleaning gas, etc., as desired.

Referring now to the drawings, FIG. 1 is a schematic representation of an ion implantation system 10, including an arc chamber 12 with a gas feed line 14 for feeding dopant source gas to the arc chamber for ionization thereof in the chamber. The arc chamber 12 thus provides an ion source chamber in which or associated with the chamber a consumable structure comprising a solid dopant source material comprising gallium nitride or gallium oxide may be provided, which is susceptible to reaction with the reaction gas for release of gallium in gaseous form to the chamber.

FIG. 2 is a cross section of the FIG. 1 ion implantation system 10 schematically showing the generation of a plasma 16 in the arc chamber 12 of such system. The arc chamber 12 includes an interior defined by interior surfaces that include sidewalls 12a, 12b, a bottom 12c, and a top 12d. The dopant gas is flowed in the direction indicated by arrow A into the dopant gas feed line 14, having monitoring thermocouples TC1 and TC2 secured thereto in monitoring relationship to determine the quality of the thermal state of the feed line and gas entering the arc chamber, as may be desirable in connection with the use of a thermal management system for the ion implantation system. The dopant gas feed line 14 may comprise a pipe or conduit having an interior layer formed of a solid dopant source material that is susceptible to reaction with a reactive gas for release of dopant in gaseous form to the ion source chamber. In such manner, a reactive carrier gas may be flowed through the dopant gas feed line, and reactively generate the dopant species (i.e., gallium). The dopant species is transported by the reactive carrier gas into the ion source chamber of the ion implantation system.

FIG. 3 is a perspective view, in cross-section, of the ion source assembly comprising the ion source apparatus 70 and an optional heat sink apparatus 50 for thermal management of the system. This cross-sectional view shows the dopant source gas feed line 72 connecting to gas flow passage 84 in the gas feed plug and to the gas flow passage 86 in the gas bushing associated with the ion source.

The ion source apparatus shown in FIG. 3 includes a base liner 80 which may be formed of a solid dopant source material (e.g., gallium nitride or gallium oxide) susceptible to reaction with a reactive gas for release of dopant in gaseous form to the ion source chamber, as an in situ generation approach to providing the dopant to the ion source chamber. The liner 80 may be modified to include an opening 82 therein, to provide further improved ion source operating life when decomposition-susceptible dopant source gases are utilized.

The foregoing arrangements illustrate the provision of a consumable structure in or associated with the ion source chamber, comprising the solid dopant source material (e.g., gallium nitride or gallium oxide) susceptible to reaction with a reactive gas for release of dopant in gaseous form to the ion source chamber. The consumable structure may be monitored for operating life, and replaced according to an ongoing maintenance schedule, as a consumable component of the ion implantation system.

FIG. 4 is a schematic representation of an ion implant process system 300 including a storage and dispensing vessel 302 holding a reactant gas which is supplied for in situ reaction with a dopant source reactant (e.g., gallium nitride or gallium oxide) in the ion source chamber to generate dopant species (gallium) for ion implantation doping of a substrate 328 in the illustrated ion implant chamber 301.

The storage and dispensing vessel 302 comprises a vessel wall 306 enclosing an interior volume holding the reactant gas.

The vessel may be a gas cylinder of conventional type, with an interior volume arranged to hold only gas, or alternatively, the vessel may contain a sorbent material having sorptive affinity for the reactant gas, and from which the co-reactant source gas is desorbable for discharge from the vessel under dispensing conditions.

The storage and dispensing vessel 302 includes a valve head 308 coupled in gas flow communication with a discharge line 312. A pressure sensor 310 is disposed in the line 312, together with a mass flow controller 314. Other monitoring and sensing components may be coupled with the line, and interfaced with control means such as actuators, feedback and computer control systems, cycle timers, etc.

The ion implant chamber 301 contains an ionizer 316 receiving the dispensed reactant gas from line 312 that is reactive with the dopant source reactant provided in or in association with the ionizer chamber to generate dopant species (gallium) that under the ionization conditions in the ionizer chamber produce an ion beam 305. The ion beam 305 passes through the mass analyzer unit 322 which selects the ions needed and rejects the non-selected ions.

The selected ions pass through the acceleration electrode array 324 and then the deflection electrodes 326. The resultingly focused ion beam is impinged on the substrate element 328 disposed on the rotatable holder 330 mounted in turn on spindle 332, to form a doped (gallium-doped) substrate as the ion implantation product.

The respective sections of the ion implant chamber 301 are exhausted through lines 318, 340 and 344 by means of pumps 320, 342 and 346, respectively.

Figure 5:
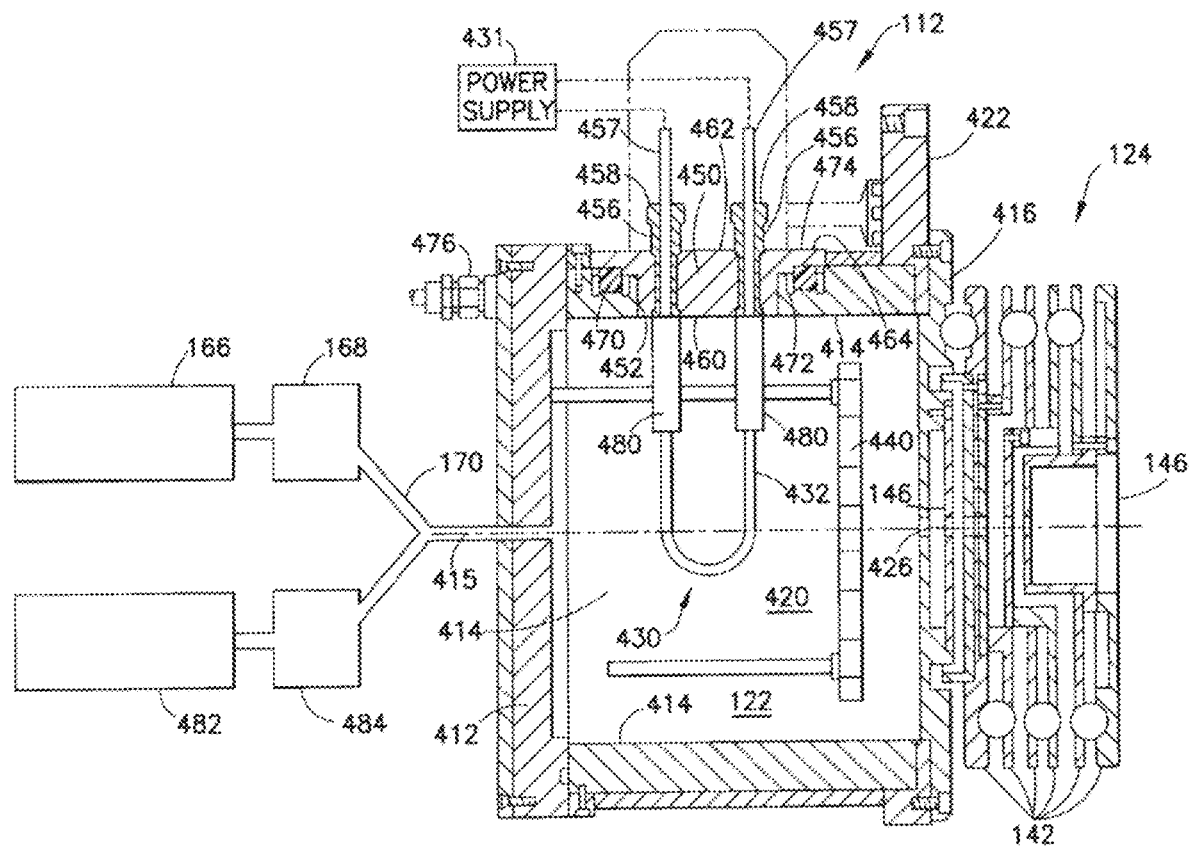
FIG. 5 is a cross-sectional view of an ion source of an ion implantation system.

FIG. 5 is a cross-sectional view of an ion source such as may be usefully employed in an ion implantation system of the type shown in FIG. 4, and which is more fully described in U.S. Pat. No. 6,135,128 issued Oct. 24, 2000 to M. A. Graf, et al.

The ion source 112 comprises a housing which defines a plasma chamber 122, and an ion extractor assembly. Energy is imparted to the ionizable dopant gas that is formed by the dopant source reactant and reactant gas, to generate ions within the plasma chamber 122. Generally, positive ions are generated, although the system alternatively may be arranged to generate negative ions. The positive ions are extracted through a slit in the plasma chamber 122 by the ion extractor assembly 124, which comprises a plurality of electrodes 142. Accordingly, the ion extractor assembly functions to extract a beam of positive ions from the plasma chamber through an extraction aperture plate 146 and to accelerate the extracted ions toward a mass analysis magnet (not shown in FIG. 5).

Reactant gas may be flowed from a source 166 of such gas and is injected into the plasma chamber 122 containing the dopant source reactant or having the dopant source reactant associated therewith, through conduit 170 containing mass flow controller 168 therein. The source 166 may include a sorbent-based gas storage and supply vessel, e.g., of a type as commercially available from Entegris, Inc. (Billerica, Mass., USA) under the trademark SDS, a pressure-regulated vessel including an internal gas pressure regulator, e.g., of a type commercially available from Entegris, Inc. (Billerica Mass., USA) under the trademark VAC, or, when a solid co-reactant material is employed, the source 166 may include a solid source vessel, e.g., of a type as commercially available from Entegris, Inc. (Billerica, Mass., USA) under the trademark ProE-Vap. The plasma chamber 122 has electrically conductive chamber walls 412, 414, 416 that bound an ionization zone 420 in the chamber interior for ionization of the reaction product of the dopant source reactant and reactant gas. Side wall 414 is circularly symmetric about a center axis 415 of the plasma chamber 122. A conductive wall 416 that faces a resolving magnet is connected to a plasma chamber support 422. Wall 416 supports the aperture plate 146 having multiple openings that allow ions to exit the plasma chamber 122 and then combine to form the ion beam at a location downstream from multiple spaced apart and electrically isolated extraction electrodes 124. The aperture plate 146 includes a number of openings arranged in a specified pattern that align with similarly configured multiple apertures in the spaced-apart extraction electrodes 142. Only one such aperture is shown in FIG. 5.

A metallic antenna 430 has a metal surface 432 exposed within the chamber interior for emitting energy into the plasma chamber 122. A power supply 434 outside the plasma chamber 122 energizes the metallic antenna 430 with a radio frequency (RF) signal of suitable character, e.g., an RF signal of approximately 13.56 megahertz (MHz), to set up an alternating electric current in the metallic antenna to induce an ionizing electric field within the plasma chamber 122. The power of the antenna may be of any magnitude suitable for the specific ionization operation, e.g., a power on the order of 500-3000 watts (W). The pressure in the source chamber can for example be on the order of 1-10 millitorr, so that the source 112 functions as a low pressure, high-density inductive source. The plasma chamber 122 may also include a magnetic filter assembly 440 extending through a region of the chamber interior between the antenna 430 and the aperture plate 146.

The antenna 430 can be positioned within the plasma chamber 122 by a removable support plate 450. The support plate 450 is supported by the side wall 414 at a location having a circular cutout 452 through which the antenna extends. A support plate 450 for the antenna 430 is sized to fit within the cutout 452 in the chamber wall 414 while positioning the exposed U-shaped metal portion 432 of the antenna 430 within the ionization zone 420.

The support plate 450 defines two through passageways that accommodate two vacuum pressure fittings 456. After elongated leg segments 457 of the antenna 430 are pushed through the fittings, end caps 458 are screwed onto the fittings to seal the region of contact between the fittings 456 and the leg segments 457. The antenna 430 is preferably U-shaped in its radiation-emitting region and may for example be constructed from aluminum. The tube has an outer diameter dimensioned to pass through the pressure fittings 456. While in use the antenna absorbs the heat from its surroundings. To dissipate this heat a coolant is routed through the center of the tube.

The plate 450 has a generally planar surface 460 that is exposed to an interior of the plasma chamber and includes a parallel outer surface 462 that faces away from the chamber interior. A flanged portion 464 of the plate 450 overlies a ring magnet 470 that surrounds the cutout in the wall 414 and that is attached to the wall 414 by connectors 472. A ferromagnetic insert 474 attached to the support plate 450 fits over the magnet 470 so that as the plate 450 is positioned within the cutout 452, the ferromagnetic insert 474 and the magnet 470 attract each other to secure the plate 450 in position with the antenna 430 extending into the chamber interior.

During operation of the ion source, heat is generated and this heat is absorbed by the walls 412, 414, 416, 418. The absorbed heat can be removed from the chamber 122 by a coolant that is introduced through a fitting 476 for routing water into a passageway through the walls and away from the chamber by a second exit fitting (not shown). By this arrangement, the temperature of the walls may be maintained at temperature below 100° C., so that the ion source 112 functions as a cold walled ion source.

A region of the antenna 430 near the support plate 450 is particularly susceptible to coating with sputtered material during operation of the ion implanter. To minimize the effect of such sputtering, two shields 480 can be slipped over the aluminum antenna before the antenna is inserted into the support plate 450. These shields are preferably constructed from aluminum and are maintained in place by a friction fit between the shields and the outer surface of the exposed aluminum of the antenna 430.

During operation of the ion source 112, deposits of dopant elements may form on the interior walls 412, 414 and 416 that bound the ionization zone 420. A cleaning gas may be flowed simultaneously with the reactant gas while the ion source 112 is operated under normal operating conditions. A cleaning gas source 482 and a corresponding mass flow controller 484 may be provided, with the cleaning gas output of the mass flow controller 484 being combined with the reactant gas output of the mass flow controller 168 in conduit 170 prior to being delivered to the plasma chamber 122. Alternatively, the reactant gas and the cleaning gas may be delivered separately to the plasma chamber. As a further alternative, the cleaning gas may be flowed to the plasma chamber subsequent to the active ion implantation operation thereof.

It will be recognized that the reactant gas source 166 may contain the reactant gas in combination with cleaning material and/or other materials, such as diluents, equilibrium-directing materials, coolants, etc.

Figure 6:
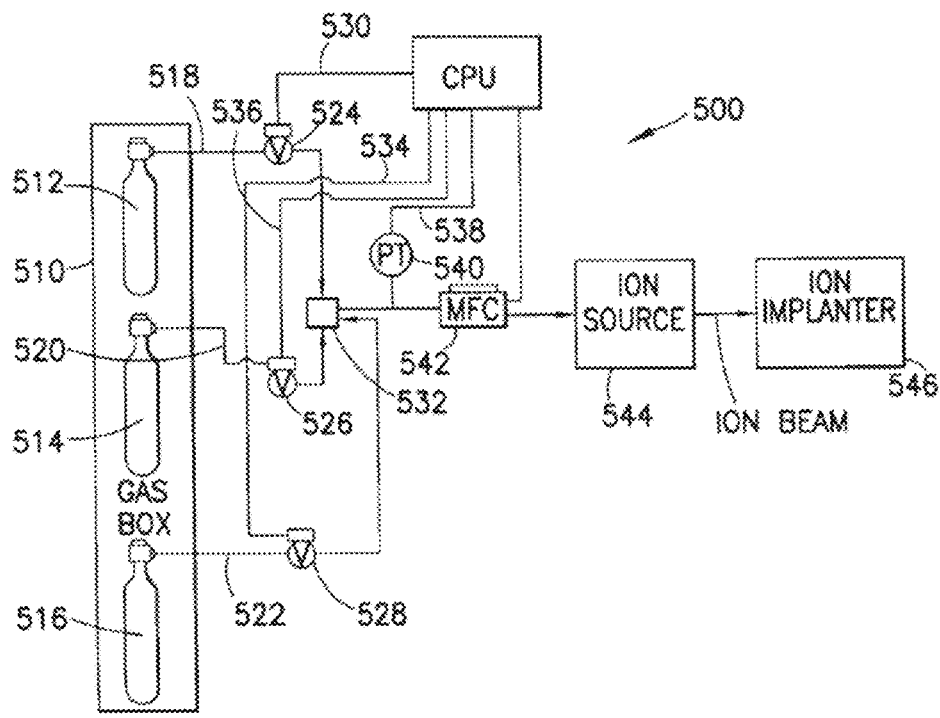
FIG. 6 is a schematic representation of an ion implantation system comprising a process monitoring and control system.

FIG. 6 is a schematic representation of an ion implantation system 500 comprising an ion source chamber 544 and a process monitoring and control system.

As shown, the ion implantation system 500 includes a gas box 510 in which are disposed gas supply cylinders including a reactant gas cylinder 512, coupled to dispensing line 518 having flow control valve 524 therein, a cleaning fluid cylinder 514 coupled to dispensing line 520 having a flow control valve 526 therein, and a diluent fluid cylinder 516 coupled to dispensing line 522 having flow control valve 528 therein. The reactant gas in cylinder 512 is arranged for reaction with a dopant source reactant provided in or associated with the ion source chamber 544 (not shown in FIG. 6).

The valves 524, 526 and 528 are connected to a central processing unit (CPU) by signal transmission lines 530, 536 and 534, respectively, whereby the CPU can operate to open or close the respective valves to a specific extent in response to a cycle time program, or other signal generating capability of the CPU that provides a valve-modulating response to process conditions and/or components monitored by the CPU.

The dispensing lines 518, 520 and 522 coupled to the respective cylinders terminate at a mixing chamber 532, so that multiple ones of the respective reactant gas, cleaning fluid and diluent fluid can be selectively mixed with one another, as desired. Alternatively, a single cylinder, viz., the reactant gas cylinder 512, may be arranged to dispense its contents to chamber 532, for flow therefrom to the feed line containing pressure transducer 540 and mass flow controller (MFC) 542 therein, and thence to the ion source chamber 544. The ion source chamber 544 is arranged for ionization operation, to ionize the dopant source therein that is produced by reaction of the reactant gas and the dopant source reactant. The ionization operation is conducted to produce an ion beam that is transmitted to the ion implanter chamber 546. The ion implanter chamber 546 contains a semiconductor or other microelectronic device substrate mounted therein for implantation of the selected ionized dopant species in the substrate.

In this illustrative system of FIG. 6, the pressure transducer 540 in the feed line to the ion source is joined in signal transmission relationship to the CPU by signal transmission line 538. The mass flow controller also is joined in signal transmission relationship to the CPU by a signal transmission line. By this arrangement of the pressure transducer, a signal is generated that is correlative of the pressure in the feed line, and transmitted in line 538 to the CPU for monitoring purposes.

During the flow of reactant gas to the ion source, pressure in the feed line is sensed by the pressure transducer 540 and transmitted in signal transmission line 538 to the CPU.

The CPU then responsively can modulate flow of the reactant gas to the ion source chamber. The CPU also can control flow of the cleaning fluid into the feed line from cylinder 514 by opening the flow control valve 526 by a control signal sent to the valve in signal transmission line 536. Alternatively, the arc power to the ion source could be reduced. As a still further alternative, the residence time of the reactant gas could be reduced by increasing the flow rate thereof, by opening of valve 524 by control signal transmitted in signal transmission line 530 to the valve, and/or by adding cleaning fluid and/or diluent fluid so that overall increase in volumetric flow rate causes the residence time of the reactant gas in the flow circuitry and ion source chamber to be reduced. In this manner, the reaction of the reactant gas with the dopant source reactant can be controllably modulated, to provide for appropriate ion implantation system operation.

In another aspect, the disclosure relates to gallium ion implantation processes comprising ionizing a gallium precursor to form gallium implant species, and implanting the gallium implant species in a substrate. The gallium precursor contains gallium nitride, gallium oxide, or an isotopically enriched analog of gallium nitride or gallium oxide comprising gallium isotopically enriched above natural abundance in $^{69}$Ga or $^{71}$Ga, and can optionally be in the form of consumable structure.

Specific embodiments include the process wherein the gallium precursor is isotopically enriched above natural abundance in $^{69}$Ga and the process wherein the gallium precursor is isotopically enriched above natural abundance in $^{71}$Ga.

The ion implantation process as broadly described above in a further aspect may be carried out with the precursor material comprising a gallium precursor isotopically enriched in $^{69}$Ga above 60%. For example, the amount of $^{69}$Ga in a total amount of gallium in the precursor may be in a range having a lower limit selected from among 65%, 70%, 75%, 80%, 85%, 90%, and 95%, and an upper limit greater than the lower limit and selected from among 75%, 80%, 85%, 90%, 95%, 98%, 99%, 99.5%, 99.8%, 99.9%, and 100%. In various embodiments, the amount of $^{69}$Ga in a total amount of gallium in the precursor may be in a range of from 65% to 100%.

Alternatively, the ion implantation process broadly described above may be carried out with the precursor material comprising a gallium precursor isotopically enriched in $^{71}$Ga above 40%. The amount of $^{71}$Ga in a total amount of gallium in such precursor may be in a range having a lower limit selected from among 45%, 50%, 55%, 60%, 65%, 70%, 75%, 80%, 85%, 90%, and 95%, and an upper limit greater than the lower limit and selected from among 75%, 80%, 85%, 90%, 95%, 98%, 99%, 99.5%, 99.8%, 99.9%, and 100%. In a specific implementation, the amount of $^{71}$Ga in a total amount of gallium in the precursor may be in a range of from 45% to 100%.

EXAMPLES

According to the invention, a solid precursor that contains gallium nitride (GaN) or that contains gallium oxide ($Ga_2O_3$), or a combination of these, when used in an arc chamber, e.g., in the form of a replaceable liner, can produce a beam current that is useful or advantageous while also resulting in a useful or relatively long source life. In specific, when compared to the use of gaseous trimethyl gallium $Ga(CH_3)_3$ as a precursor, in an ion source chamber, a solid precursor made of gallium nitride or gallium oxide as described herein, e.g., formed as a replaceable ion source chamber liner, can produce a useful or advantageously high beam current, and can provide a source of gallium ions that can be continuous for a period of time that is substantially greater than that provided by the gaseous trimethyl gallium.

1. Gaseous Trimethyl Gallium Precursor (Comparison).

Figure 7A:
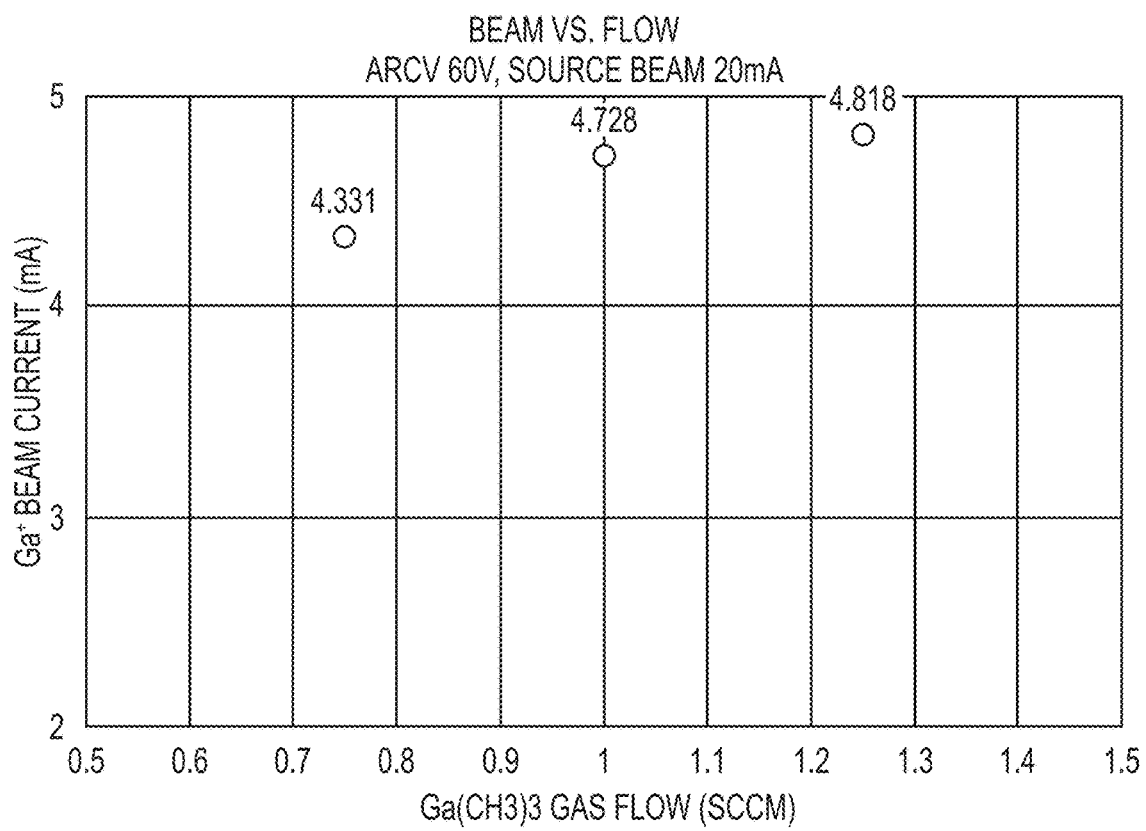
FIG. 7A shows beam current data using a trimethyl gallium precursor.

FIG. 7A shows an example of Ga+ beam current achieved using various flow levels of trimethyl gallium as a precursor, with the following test reactor conditions.

Arc Voltage=60V
Source Beam=20 mA

As shown at FIG. 7A, at 1 sccm, arc voltage 60V, and source beam 20 mA, up to 4.728 mA of Ga+ beam current was achieved. At 1.25 sccm, 4.818 mA beam current was achieved. But the beam was not stable at that time.

The source was able to operate only for up to about 2 hours before the beam became unstable. The beam instability was believed to be due to contamination of the ion chamber in the form of carbon/gallium buildup at the interior, with the carbon/gallium being derived from the trimethyl gallium.

2. Gallium Oxide Precursor

FIGS. 8A through 8E show experimental examples of Ga+ beam current achieved by using solid gallium oxide as replaceable chamber liner with varied types and amounts of co-reactants, and the following general test conditions:

Arc Voltage=varied (60V, 90V, 120V)
Source Beam=20 mA
Co-reactant=varied

Figure 8A:
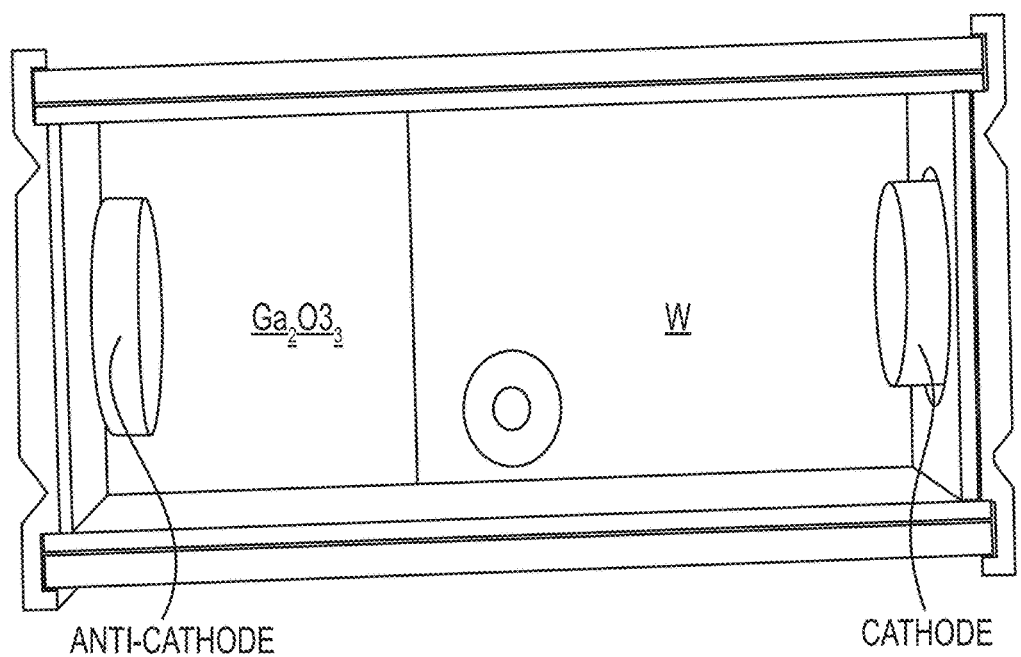
FIG. 8A is a top-down view of an ion source chamber as described, containing a gallium oxide replaceable liner as a consumable structure.

FIG. 8A is a top-down view of an interior of an ion source chamber that includes a replaceable sheet of gallium oxide at a bottom surface of the interior adjacent to an anti-cathode (the left end of the chamber, in the figure). All other interior surfaces of the ion source chamber (the remaining portion of the bottom, the sides, and the top) are tungsten.

Figure 8B:
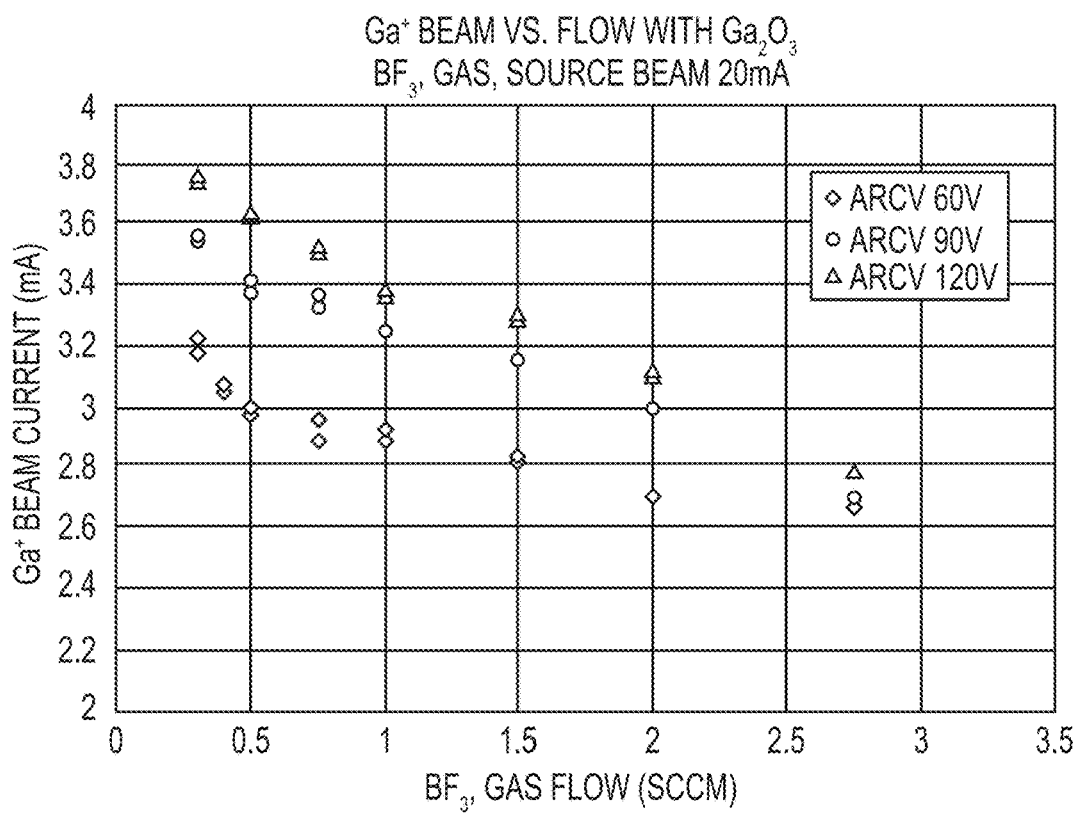
FIGS. 8B through 8E show gallium ion beam current data by use of a gallium oxide replaceable liner as a precursor.

FIG. 8B shows that useful beam currents were achieved at different $BF_3$ flow rates and arc voltages.

Figure 8C:
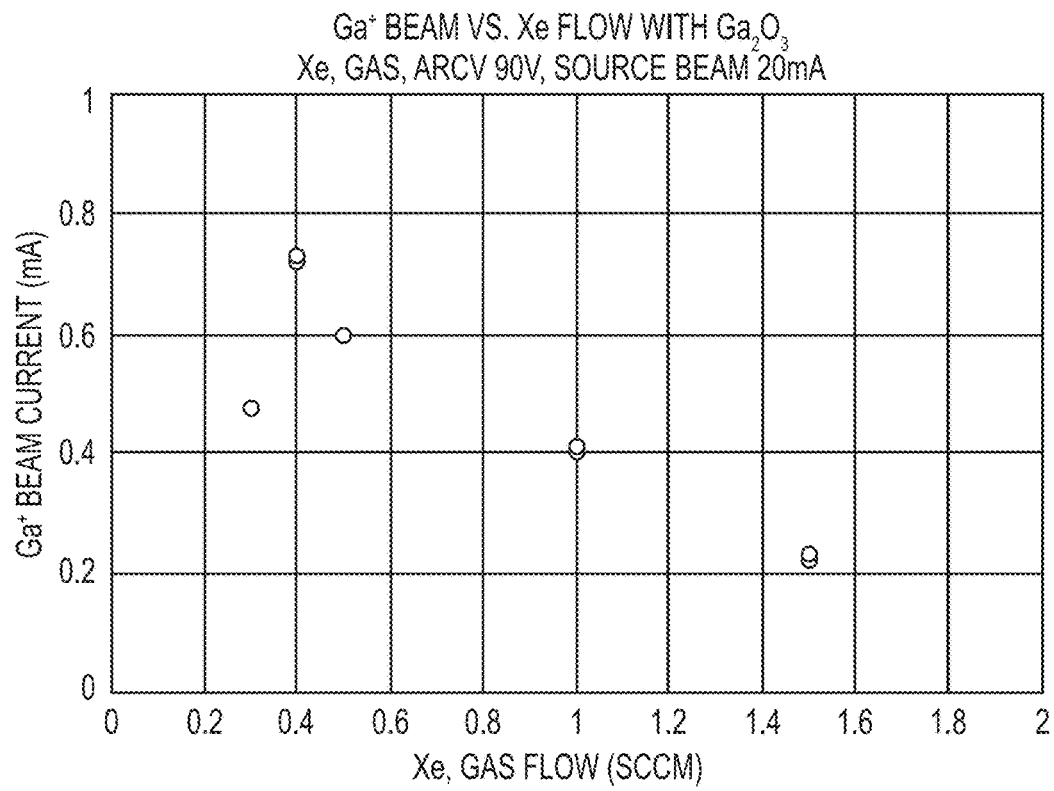
Figure 8D:
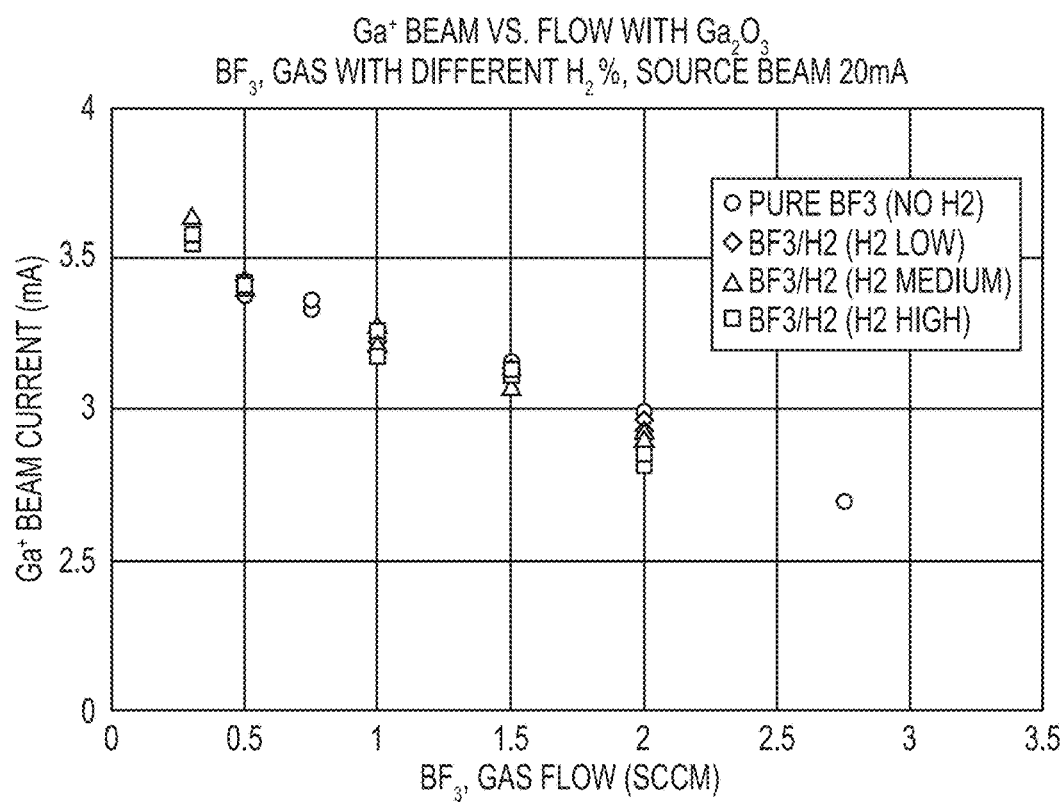
Figure 8E:
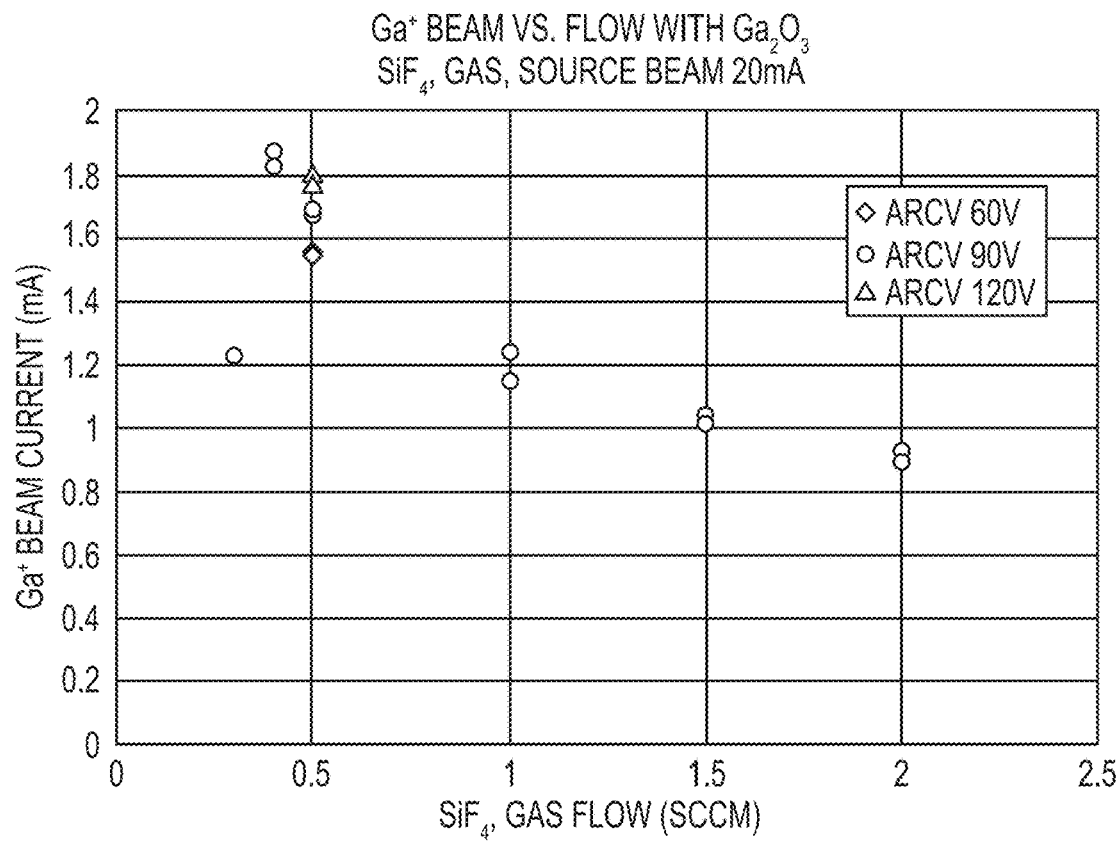

FIGS. 8C, 8D, and 8E show beam current values for xenon as a co-reactant, for $BF_3$ with different levels of hydrogen, and for $SiF_4$ as a co-reactant.

3. Gallium Nitride

FIGS. 9A through 9D show examples of beam Ga+ current achieved by using gallium nitride, varied co-reactants, and the following general test conditions:

Arc Voltage=varied (60V, 90V, 120V)
Source Beam=20 mA
Co-reactant=varied

Figure 9A:
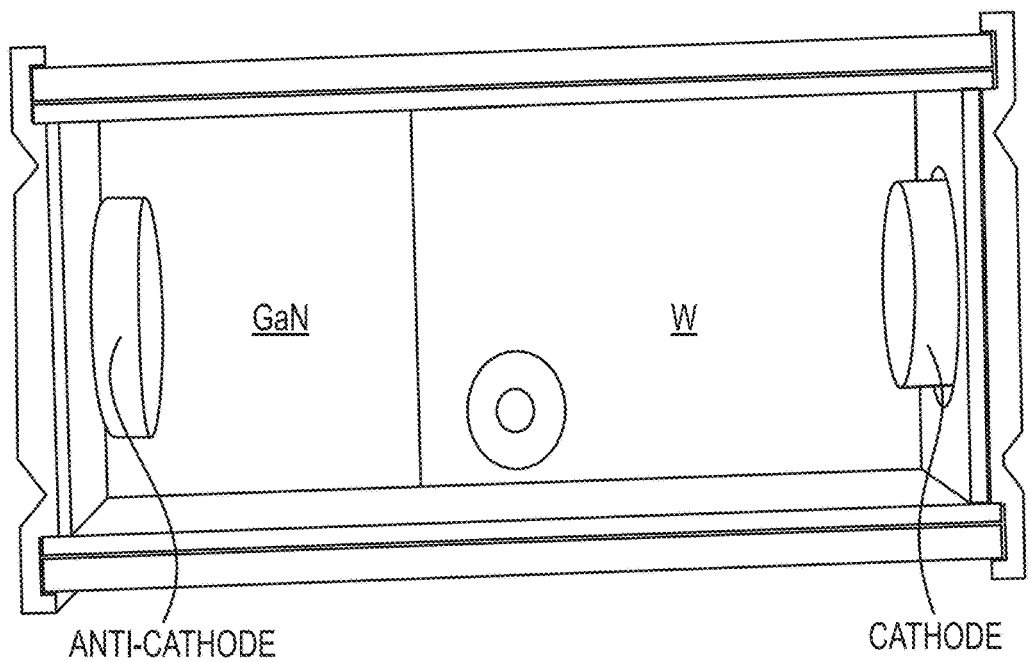
FIG. 9A is a top-down view of an ion source chamber as described, containing a gallium nitride replaceable liner as a consumable structure.

FIG. 9A is a top-down view of an interior of an ion source chamber that includes a replaceable sheet of gallium oxide at a bottom surface of the interior adjacent to an anti-cathode (the left end of the chamber, in the figure). All other interior surfaces of the ion source chamber are tungsten.

Figure 9B:
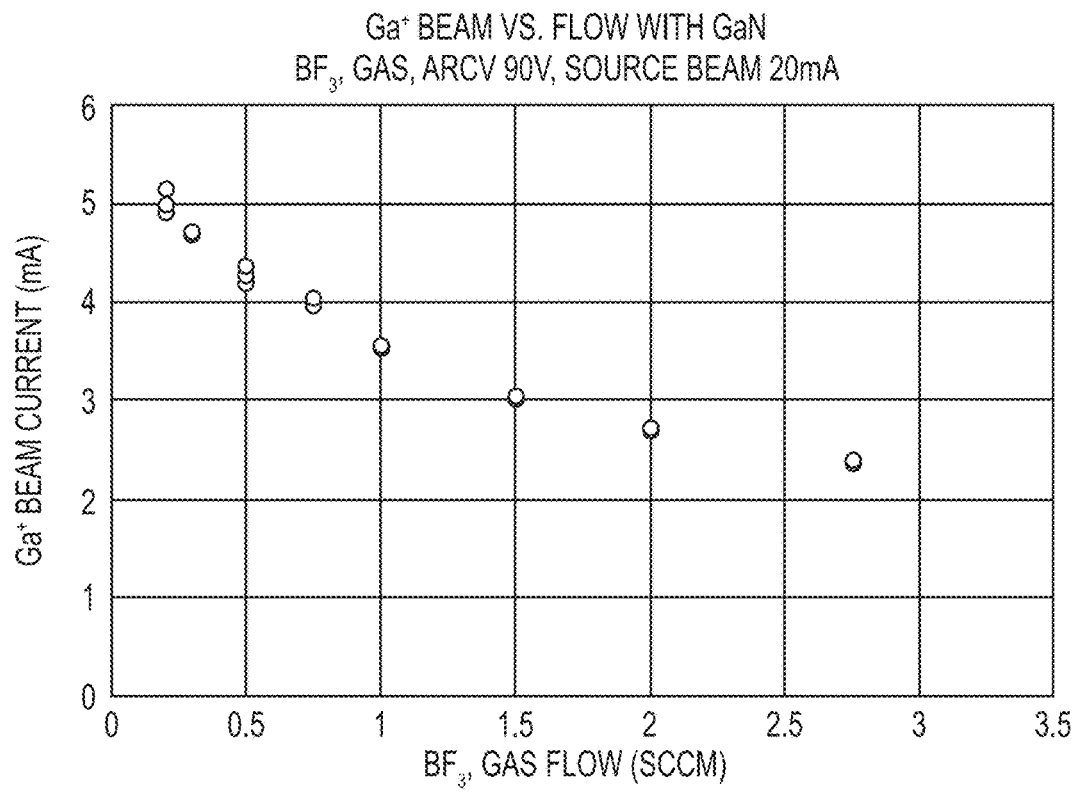
FIGS. 9B through 9D show gallium ion beam current data by use of a gallium nitride replaceable liner as a precursor.

FIG. 9B shows that useful beam currents were achieved at different $BF_3$ flow rates and arc voltages.

Figure 9C:
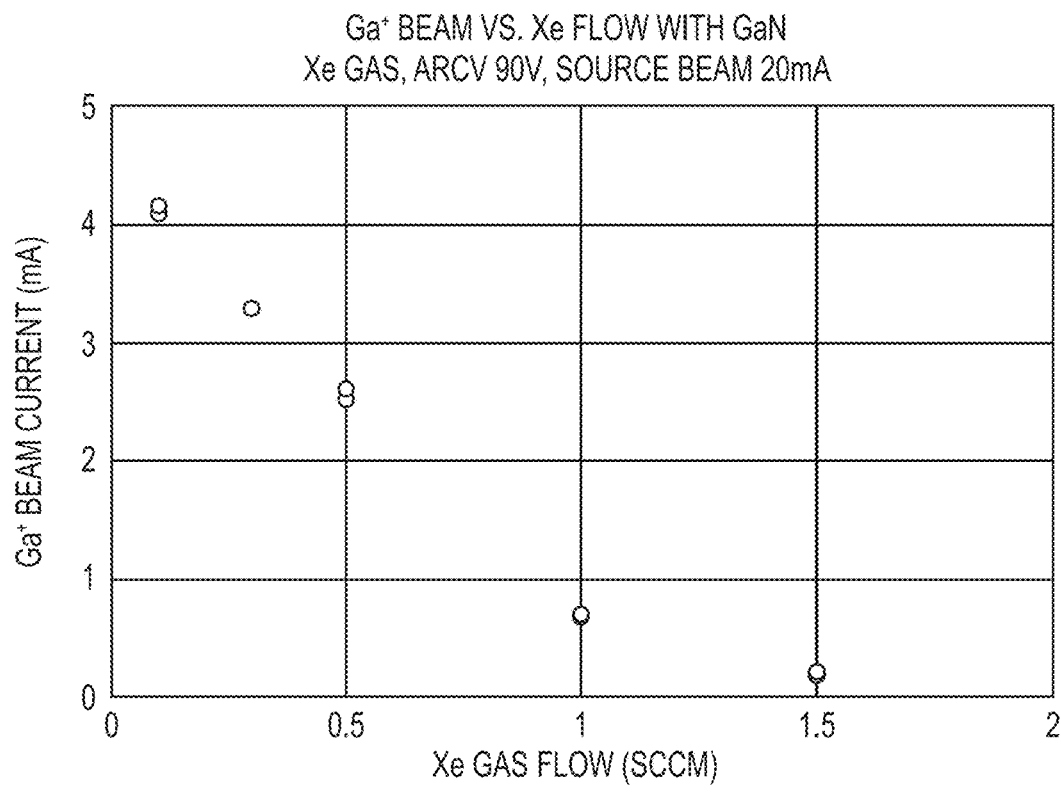
Figure 9D:
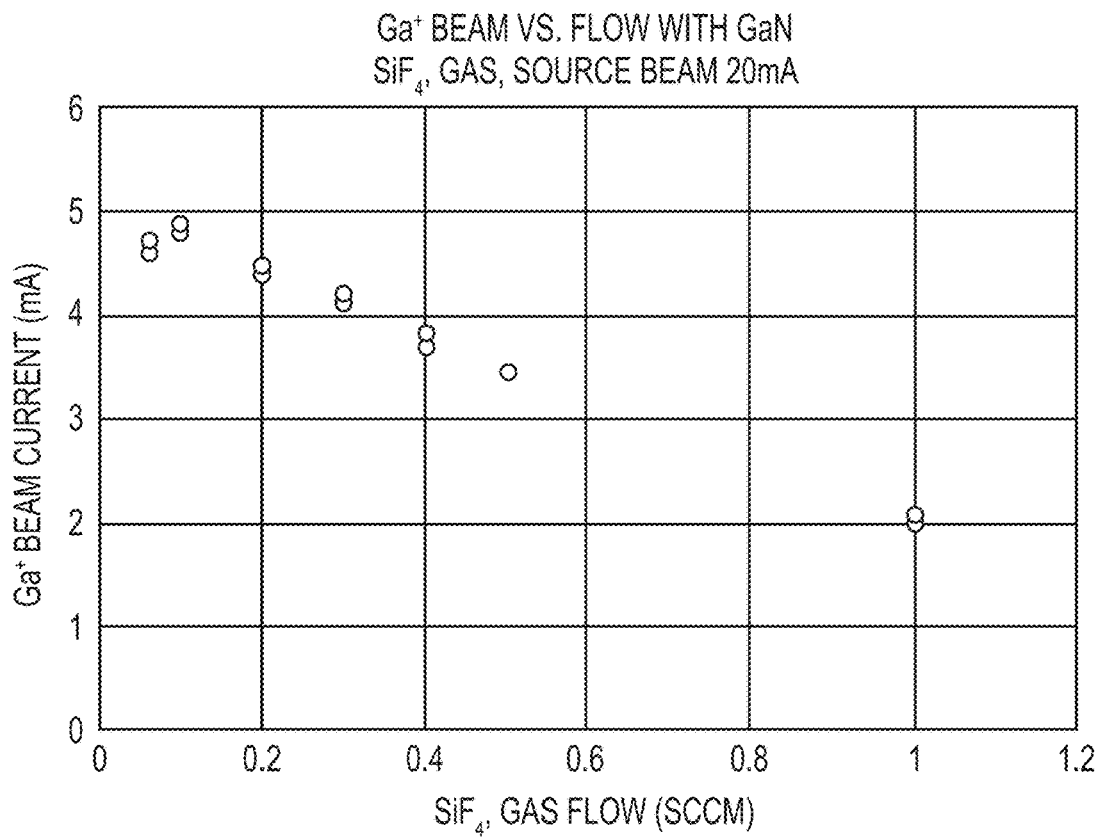

FIGS. 9C and 9D show beam current values for xenon and $SiF_4$ as a co-reactants.

4. Gallium Nitride Consumable in Combination with a Separate Gallium Oxide Consumable Structure in an Ion Source Chamber FIGS. 10A through 10D show examples of Ga+ beam current achieved by using gallium nitride as a consumable structure (replaceable liner) in combination with a separate gallium oxide consumable structure (replaceable liner) in a single ion source chamber, with varied co-reactants and the following general test conditions:

Arc Voltage=varied (60V, 90V, 120V)
Source Beam=20 mA
Co-reactant=varied

Figure 10A:
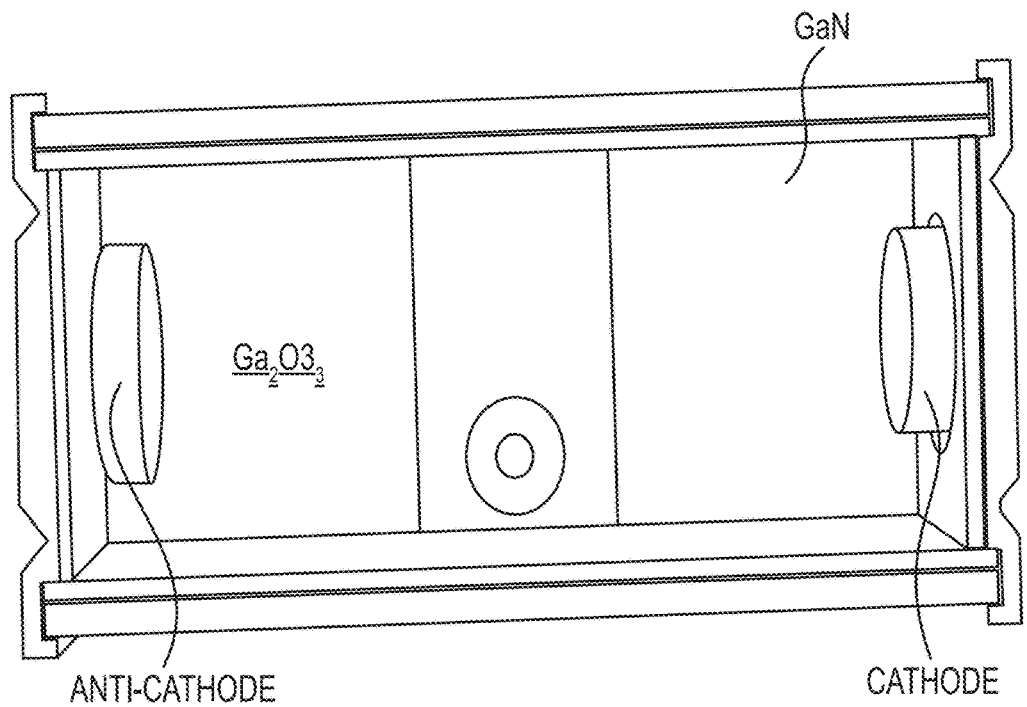
FIG. 10A is a top-down view of an ion source chamber as described, containing a gallium oxide replaceable liner as a consumable structure and also containing a gallium nitride replaceable liner as a consumable structure.
Figure 10B:
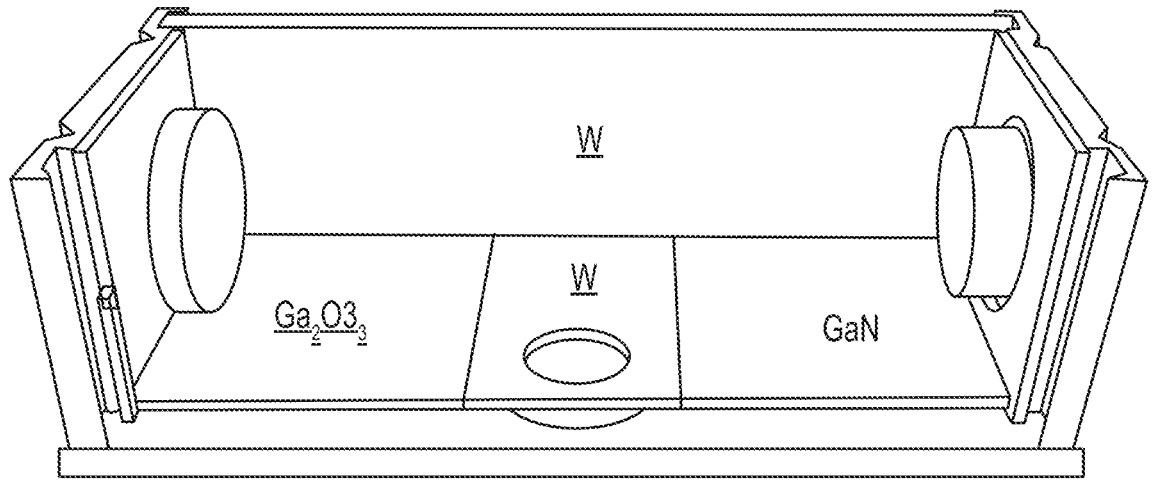
FIG. 10B is a side-perspective view of the ion source chamber of FIG. 10A.

FIG. 10A is a top-down view of an interior of an ion source chamber that includes a replaceable sheet of gallium oxide at a bottom surface of the interior adjacent to an anti-cathode (the left end of the chamber, in the figure), and a second replaceable sheet, gallium nitride, at a bottom surface of the interior adjacent to a cathode (the right end of the chamber, in the figure). FIG. 10B is a side-perspective view of the interior with replaceable sheets of gallium oxide and gallium nitride at the interior bottom surface.

All other interior surfaces of the ion source chamber are tungsten.

Figure 10C:
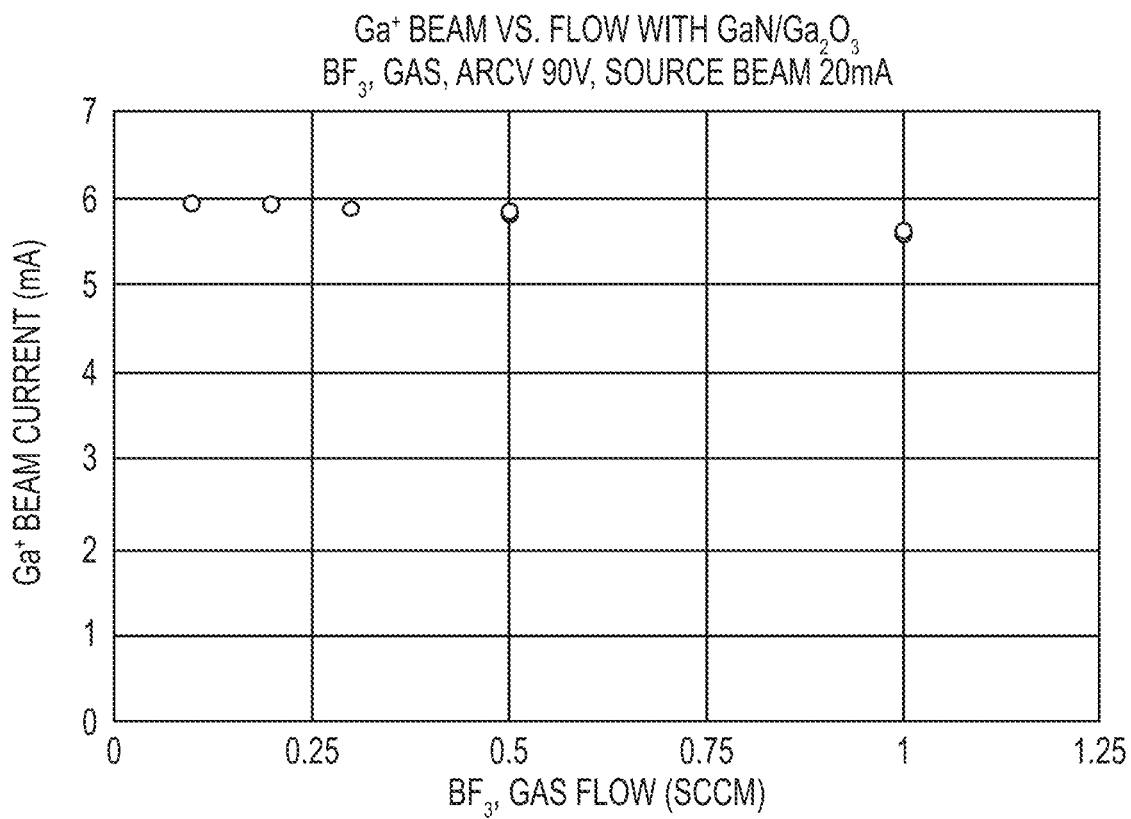
FIGS. 10C and 10D show gallium ion beam current data by use of a combination of gallium nitride replaceable liner, and gallium oxide replaceable liner, as precursors.

FIG. 10C shows that useful beam currents were achieved at different $BF_3$ flow rates, and the beam current did not suffer a beam current reduction with higher flow rates of $BF_3$.

Figure 10D:
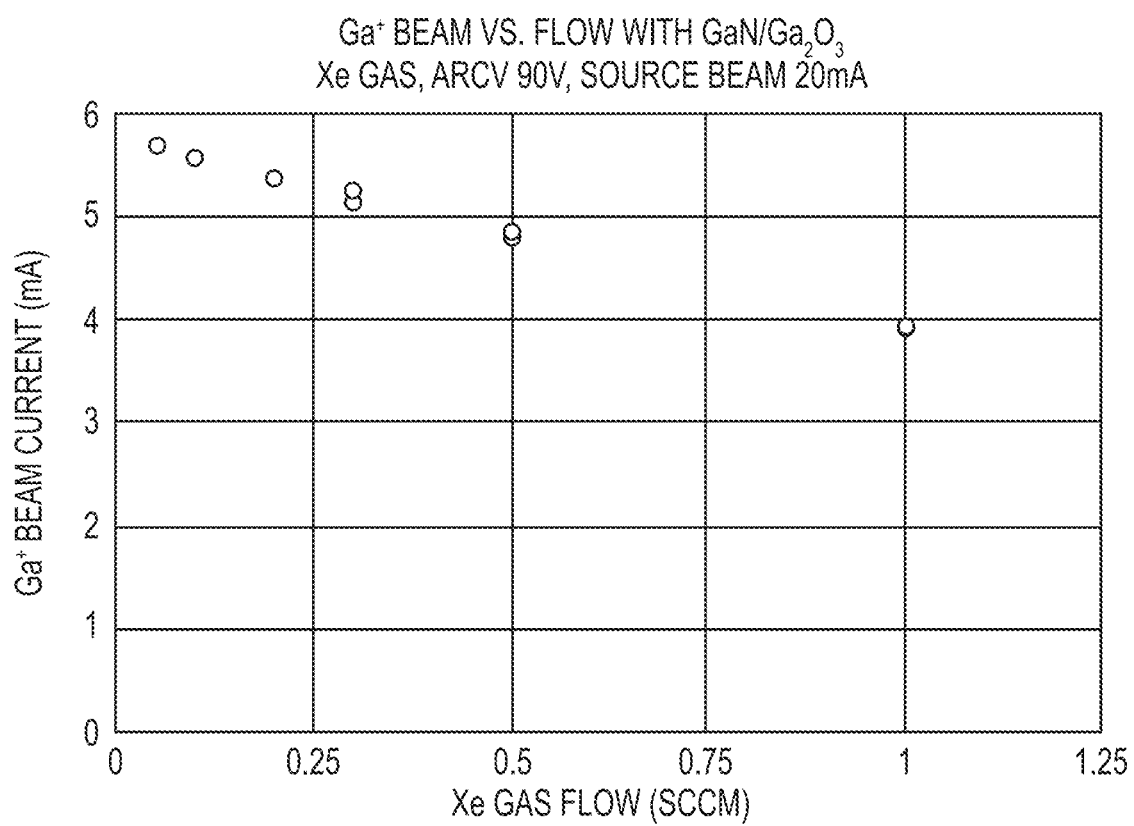

FIG. 10D shows useful beam current values when xenon is used as a co-reactant gas.

The invention claimed is:

1. An ion source apparatus capable of generating gallium ions, the apparatus comprising:
    an arc chamber including an interior defined by interior surfaces that include sidewalls, a bottom, and a top; and
    a consumable structure disposed in the arc chamber, wherein the consumable structure comprises one or more gallium-containing sheet structures disposed in the interior and covering one or more of the interior surfaces, the one or more gallium-containing sheet structures comprising gallium nitride, gallium oxide, or a combination thereof.

2. The apparatus of claim 1 wherein the one or more gallium-containing sheet structures are removable from the interior of the ion source chamber.

3. The apparatus of claim 1, wherein the one or more gallium-containing sheets structures comprise at least 80 percent by weight gallium nitride.

4. The apparatus of claim 1, wherein the one or more gallium-containing sheet structures comprise at least 80 percent by weight gallium oxide.

5. The apparatus of claim 1 wherein the one or more gallium-containing sheet structures comprise at least 80 percent by weight of a combination of gallium oxide and gallium nitride.

6. The apparatus of claim 1, wherein the interior contains:
    one or more gallium-containing sheets structures comprise at least 80 percent by weight gallium nitride, and
    one or more gallium-containing sheet structures comprise at least 80 percent by weight gallium oxide.

7. The apparatus of claim 1, wherein the one or more gallium-containing sheet structures cover from about 5 percent to about 80 percent of a total area of the interior surfaces of the chamber.

8. The apparatus of claim 1, wherein the gallium nitride, gallium oxide, or combination thereof, contains greater than 60 percent 69Ga based on a total amount (atomic) of gallium in the gallium nitride, gallium oxide, or combination thereof.

9. The apparatus of claim 1, wherein the amount of 69Ga in the gallium nitride, gallium oxide, or combination thereof, is in a range of from 65% to 100% based on a total amount (atomic) of gallium in the gallium nitride, gallium oxide, or combination thereof.

10. The apparatus of claim 1, wherein the gallium nitride, gallium oxide, or combination thereof contains greater than 40 percent $^{71}$Ga based on a total amount (atomic) of gallium in the gallium nitride, gallium oxide, or combination thereof.

11. The apparatus of claim 1, wherein the amount of $^{71}$Ga in the gallium nitride, gallium oxide, or combination thereof, is in a range of from 45% to 100% based on a total amount (atomic) of gallium in the gallium nitride, gallium oxide, or combination thereof.

12. The apparatus of claim 1, comprising a source of reactant gas in fluid communication with the interior surface.

13. The apparatus of claim 1, wherein the reactant gas selected from $BF_3$, $B_2F_4$, $SiF_4$, $Si_2F_6$, $GeF_4$, $PF_3$, $PF_5$, $AsF_3$, $AsF_5$, $XeF_2$, $XeF_4$, $XeF_6$, $WF_6$, $MoF_6$, $C_nF_{2n+2}$, $C_nF_{2n}$, $C_nF_{2n-2}$, $C_nH_xF_{2n+2-x}$, $C_nH_xF_{2n-x}$, $C_nH_xF_{2n-2-x}$ (n=1, 2, 3 ..., x=0, 1, 2 ... ), $COF_2$, $CO$, $CO_2$, $SF_6$, $SF_4$, $SeF_6$, $NF_3$, $N_2F_4$, HF, Xe, He, Ne, Ar, Kr, $N_2$, $H_2$, $eBF_3$, $eGeF_4$ and combinations thereof.

14. The apparatus of claim 13 wherein the source of reactant gas comprises a combination of selected from: $BF_3$ and $H_2$; $SiF_4$ and $H_2$; $BF_3$ and Xe; $SiF_4$ and Xe; $BF_3$, $H_2$, and Xe; or $SiF_4$, $H_2$, and Xe.

15. A method of forming gallium ion, the method comprising:
    generating ionized gallium in an arc chamber including an interior defined by interior surfaces that include sidewalls, a bottom, and a top, wherein the arc chamber has a consumable structure disposed therein, and wherein the consumable structure comprises one or more gallium-containing sheet structures disposed in the interior and covering one or more of the interior surfaces, the one or more gallium-containing sheet structures comprising gallium nitride, gallium oxide, or a combination thereof, and
    contacting the consumable structure with a reactant gas to generate gallium ions.

16. The method of claim 15, wherein the consumable structure is a removable liner.

17. The method of claim 15, wherein the one or more gallium-containing sheets comprise at least 80 percent by weight gallium nitride.

18. The method of claim 15, wherein the one or more gallium-containing sheets comprise at least 80 percent by weight gallium oxide.

* * * * *